(12) United States Patent
Gabara et al.

(10) Patent No.: US 6,515,533 B1
(45) Date of Patent: Feb. 4, 2003

(54) MULTI-INPUT COMPARATOR

(75) Inventors: Thaddeus John Gabara, Murray Hill, NJ (US); Syed Aon Mujtaba, Berkeley Heights, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/162,852

(22) Filed: Sep. 29, 1998

(51) Int. Cl.[7] .......................... H03K 17/62; G01R 19/00
(52) U.S. Cl. ........................ 327/407; 327/99; 327/51
(58) Field of Search .......................... 327/51, 52, 58, 327/60, 65, 71, 82, 407, 89, 90, 99

(56) References Cited

U.S. PATENT DOCUMENTS

| | | | | |
|---|---|---|---|---|
| 5,408,192 A | * | 4/1995 | Bailey | 327/254 |
| 5,604,452 A | * | 2/1997 | Huang | 326/46 |
| 6,111,437 A | * | 8/2000 | Patel | 327/407 |
| 6,157,236 A | * | 12/2000 | Rajivan et al. | 327/276 |

OTHER PUBLICATIONS

S. Aur et al., "Identification of DRAM Sense–Amplifier Imbalance Using Hot carrier Evaluation," IEEE Journal of Solid–State Circuits, vol. 27, No. 3, pp. 451–453, Mar. 1992.

* cited by examiner

*Primary Examiner*—My-Trang Nuton
(74) *Attorney, Agent, or Firm*—Ryan, Mason & Lewis, LLP

(57) ABSTRACT

A multi-input comparator in accordance with the invention determines a minimum or maximum signal value in a given set of signal values. An illustrative embodiment of the multi-input comparator includes N inputs and generates an output corresponding to the maximum or minimum value in a set of signal values applied to the N inputs. The comparator includes a first comparison circuit, such as a sense amplifier, having inputs for receiving a subset of the N signal values, such as a pair of the inputs. The comparator also includes a first multiplexer having a select signal input coupled to an output of the first comparison circuit, and inputs coupled to the subset of the N signal values. The comparator further includes N-2 additional comparison circuits and N-2 additional multiplexers, with the N-2 additional multiplexers coupled to corresponding ones of the N-2 additional comparison circuits. The comparison circuits and multiplexers are arranged to select a particular one of the N signal values, e.g., the maximum or the minimum value. The additional comparison circuits and multiplexers may be arranged in, for example, a linear architecture or a logarithmic architecture. The comparator may be used in conjunction with a position determination circuit which indicates the position of the maximum or minimum value in the set of signal values, or produces a desired ordering of the signal values.

20 Claims, 7 Drawing Sheets

IF $x_1 > x_2$ THEN $d_1 = 1$ AND $d_2 = 0$

IF $x_1 < x_2$ THEN $d_1 = 0$ AND $d_2 = 1$

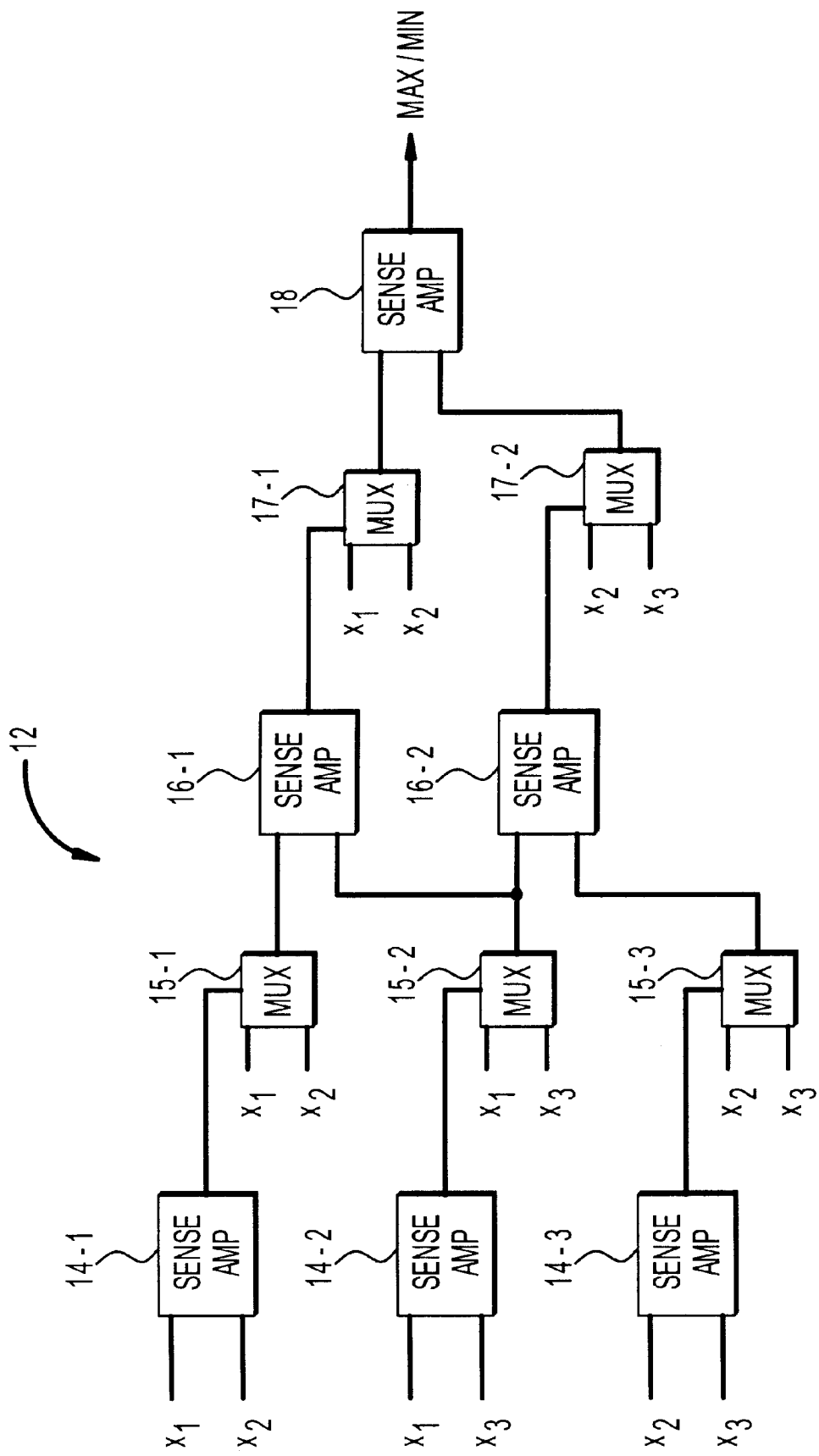

MULTI-INPUT COMPARATOR

RELATED APPLICATION

The present application is related to U.S. patent application Ser. No. 09/162,851 of Thaddeus J. Gabara entitled "Multi-Input Comparator," filed concurrently herewith and assigned to the assignee of the present application, and subsequently issued as U.S. Pat. No. 6,191,623 on Feb. 20, 2001.

FIELD OF THE INVENTION

The present invention relates generally to electronic circuits, and more particularly to comparator circuits which can support two or more inputs.

BACKGROUND OF THE INVENTION

Conventional comparators generally determine which of two inputs is the greater or the lesser of the two. An example of such a comparator is a sense amplifier typically used in applications such as dynamic random access memory (DRAM) cells. FIG. 1 illustrates the operation of a conventional sense amplifier 10. The amplifier 10 receives two inputs, $x_1$ and $x_2$, and generates two outputs, $d_1$ and $d_2$. If the value of input $x_1$ is greater than that of input $x_2$, the output $d_1$ is at a logic high level, i.e., $d_1=1$, and the output $d_2$ is at a logic low level, i.e., $d_2=0$. Alternatively, if the value of input $x_1$ is less than that of input $x_2$, the output $d_1=0$, and the output $d_2=1$. The values of the outputs $d_1$ and $d_2$ thus indicates the relative values of the inputs. Additional details regarding the operation of a conventional sense amplifier can be found in, for example, S. Aur et al., "Identification of DRAM Sense-Amplifier Imbalance Using Hot Carrier Evaluation," IEEE Journal of Solid-State Circuits, Vol. 27, No. 3, pp. 451–453, March 1992.

Unfortunately, using conventional comparators to determine, for example, which of three inputs is greater or lesser than the others, generally results in circuit arrangements which exhibit excessive computation time and signal delay, require a large amount of circuit area, and consume a large amount of power. Other problems associated with conventional multi-input comparators include, for example, an inability to determine a maximum or minimum input value from among any given set of N inputs, and an inability to arrange the inputs in an ascending or descending order.

As is apparent from the above, further improvements are needed in order to provide multi input comparators which are more computationally efficient, exhibit less signal delay, require less circuit area, and consume less power. Moreover, a need exists for a multi-input comparator which can identify the maximum or minimum value from among a set of inputs, or arrange the inputs in an ascending or descending order.

SUMMARY OF THE INVENTION

A multi-input comparator in accordance with the invention determines a minimum or maximum signal value in a given set of input signal values. The multi-input comparator includes a series combination of a first comparison circuit, such as a sense amplifier, and a first multiplexer. A subset of the set of input signal values is applied to inputs of the first sense amplifier. The first multiplexer also receives as its inputs the signal values applied to the first comparison circuit, and a select signal input of the first multiplexer is driven by an output of the first comparison circuit. The output of the first multiplexer is used as an input for one or more additional groups of circuitry, each including series combination of a comparison circuit and a corresponding multiplexer. These additional groups of circuitry may be arranged in a linear architecture, a logarithmic architecture or combinations of these architectures. Accordingly, depending on the particular combination of the additional groups, the comparator may be configured with any desired number N of inputs. The output of one of the multiplexers in one of the additional groups of circuitry corresponds to either the maximum or minimum value of the set of input signal values. Including the first comparison circuit and multiplexer, a comparator for processing a set of N signal values has a total of N-1 groups of circuitry, each including a comparison circuit and a multiplexer.

In accordance with another aspect of the invention, the multi-input comparator may be used in conjunction with a position determination circuit which indicates the position of the maximum or minimum value in the set of signal values. Advantageously, the information generated by the position determination circuit may also be used to produce a desired ordering of the input signal values, such as a list of the signal values in ascending or descending order of signal value magnitude.

A multi-input comparator in accordance with the invention can provide substantial improvements in computation time, signal delay, required circuit area and power consumption. In addition, a multi-input comparator in accordance with the invention may be utilized with a variety of different types of comparison circuits, including sense amplifiers having two inputs or sense amplifiers having more than two inputs. These and other features and advantages of the present invention will become more apparent from the accompanying drawings and the following detailed description.

BRIEF DESCRIPTION OF THE DRAWINGS

FIG. 2 shows one possible implementation of a three-input comparator in accordance with the invention.

DETAILED DESCRIPTION OF THE INVENTION

The present invention will be illustrated herein using a number of exemplary circuits. It should be understood, however, that the invention is more generally suitable for use in any multiple input comparator circuit. For example, although illustrated using two-input sense amplifiers, the invention can be used with sense amplifiers having more than two inputs, and with other types of comparison circuits. In addition, the invention can be used to implement a comparator circuit having any desired number N of inputs. The term "comparison circuit" should be understood to include any type of device which is capable of determining a relative magnitude or other relative characteristic of two or more input signals. Examples of comparison circuits include sense amplifiers and other types of conventional comparators.

Figure 1:
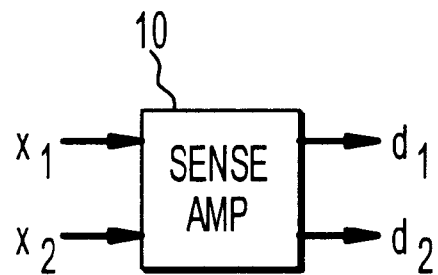
FIG. 1 shows a conventional sense amplifier.

FIG. 2 illustrates one possible arrangement of a three-input comparator 12 in accordance with the invention, implemented using a conventional sense amplifier such as sense amplifier 10 of FIG. 1. At a first stage of comparison, pairs of inputs $x_1x_2$, $x_1x_3$ and $x_2x_3$ are applied to sense amplifiers 14-1, 14-2 and 14-3, respectively. The outputs of sense amplifiers 14-1, 14-2 and 14-3 are applied to select signal inputs of multiplexers 15-1, 15-2 and 15-3, respectively. Each of these multiplexers receives as inputs the same inputs of the corresponding sense amplifier. The multiplexers are thus used to select one of the inputs in each of the pairs for propagation to a second stage of comparison, implemented using sense amplifiers 16-1 and 16-2. As in the previous stage, the outputs of sense amplifiers 16-1 and 16-2 are applied to select signal inputs of multiplexers 17-1 and 17-2, respectively. These multiplexers select two inputs for application to a third and final stage of comparison, implemented by sense amplifier 18. The output of the sense amplifier 18 is the maximum value of the $x_1$, $x_2$, and $x_3$ inputs.

Figure 3:
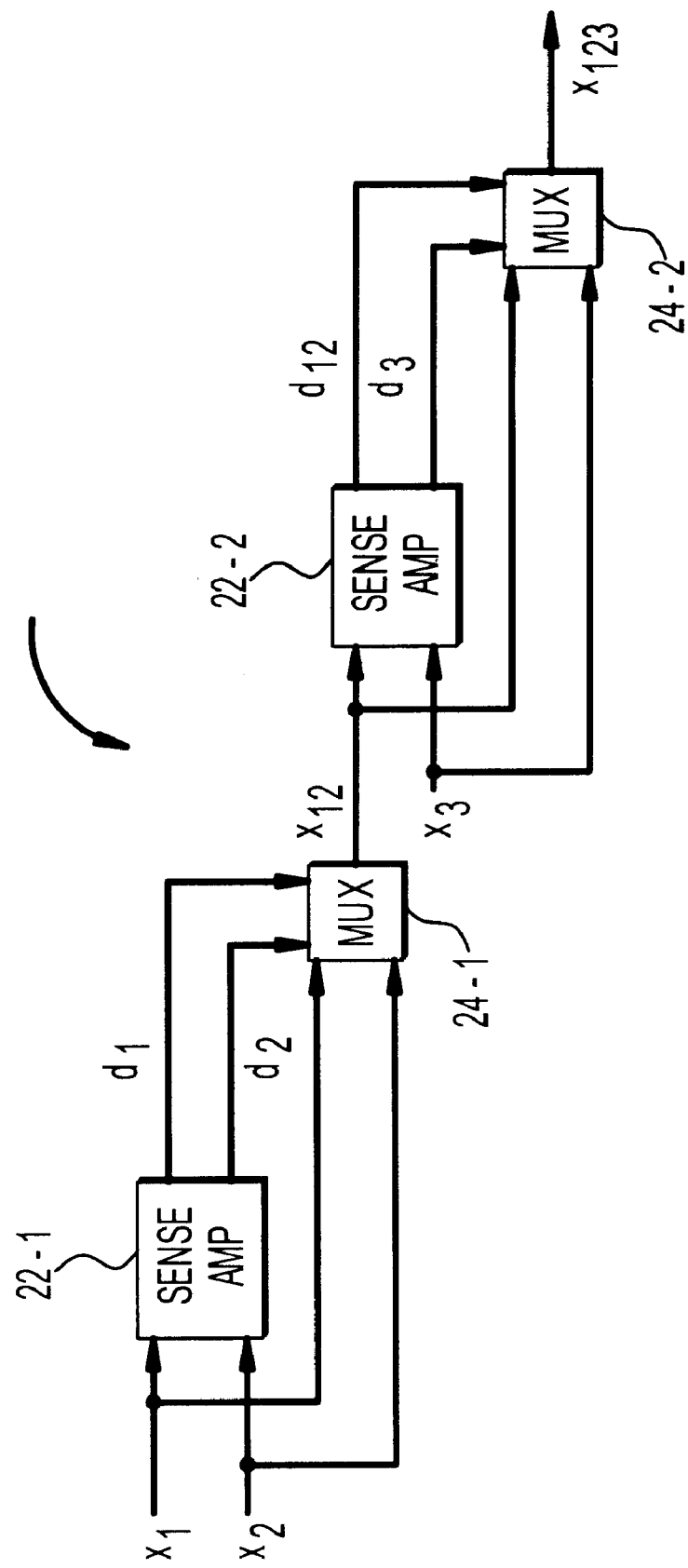
FIG. 3 shows an illustrative embodiment of a simplified three-input comparator with a linear architecture in accordance with the invention.

FIG. 3 shows an illustrative embodiment of a three-input comparator 20 in accordance with the invention. This embodiment of the invention provides significant improvements in terms of computation speed, signal delay, circuit area and power consumption, relative to the three-input comparator of FIG. 2. The comparator 20 includes first and second two-input sense amplifiers 22-1 and 22-2, and first and second two-input multiplexers 24-1 and 24-2. The first sense amplifier 22-1 receives two inputs, $x_1$ and $x_2$, and generates two outputs, $d_1$ and $d_2$, and may operate in substantially the same manner as the conventional sense amplifier 10 of FIG. 1. The $d_1$ and $d_2$ outputs of sense amplifier 22-1 are applied to select signal inputs of the multiplexer 24-1. The inputs $x_1$ and $x_2$ are applied as signal inputs to the multiplexer 24-1. The output of the multiplexer 24-1 is a signal $x_{12}$ which corresponds to either the input $x_1$ or the input $x_2$, depending on the values of the signals $d_1$ and $d_2$. The signal $x_{12}$ is applied with a third input signal $x_3$ to inputs of the second sense amplifier 22-2. The sense amplifier 22-2, which also may operate in substantially the same manner as the conventional sense amplifier 10 of FIG. 1, generates outputs $d_{12}$ and $d_3$. These outputs are supplied to select signal inputs of the multiplexer 24-2. The inputs $x_{12}$ and $x_3$ are applied as signal inputs to the multiplexer 24-2. The output of the multiplexer 24-2 is a signal $x_{123}$ which corresponds to either the input $x_{12}$ or the input $x_3$, depending on the values of the signals $d_{12}$ and $d_3$.

Assuming that the sense amplifiers operate in the manner illustrated in conjunction with FIG. 1, the output $x_{123}$ will correspond to the maximum value of the three inputs $x_1$, $x_2$ and $x_3$. Under this assumption, for example, if input $x_1$ is the greatest of the three inputs, the outputs of sense amplifier 22-1 will be $d_1=1$ and $d_2=0$. Multiplexer 24-1 will therefore select input $x_1$ for propagation to output $x_{12}$. The outputs of sense amplifier 22-2 will then be $d_{12}=1$ and $d_3=0$, such that multiplexer 24-2 will propagate $x_{12}=x_1$ to the output $x_{123}$. The greatest of the three inputs of comparator 20 is thus propagated to the output of comparator 20. It will be apparent to those skilled in the art that the comparator 20 can also be configured such that the output $x_{123}$ will correspond to the minimum value of the three inputs $x_1$, $x_2$ and $x_3$. In addition, the linear architecture illustrated in FIG. 3 can be extended in a straightforward manner to accommodate more than three inputs, and is generally applicable to any number N of inputs.

Figure 4A:
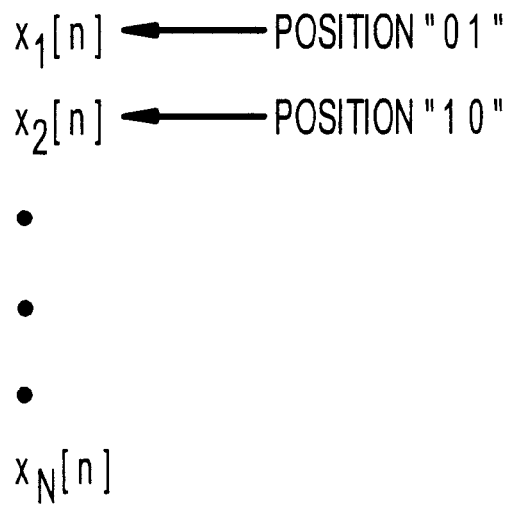
FIG. 4A illustrates a position determination function which can be implemented using signals generated by a multi-input comparator in accordance with the invention.

FIG. 4A illustrates a set of N analog input values $x_1[n]$, $x_2[n]$ ... $x_N[n]$ at a time n. As noted previously, it is often desirable in applications in which such sets of values are processed to determine not only the maximum or the minimum value but also its position in the set. The position of a given value may be designated by a binary code. For example, as shown in FIG. 4A, the position of value $x_1[n]$ may correspond to a position "01", while the position of value $x_2[n]$ may correspond to a position "10", and so on. As will be described in greater detail below, the present invention provides techniques for using signals generated in a comparator circuit, for example, the sense amplifier output signals $d_1$, $d_2$, $d_{12}$ and $d_3$ in comparator 20, to determine the position of a given value within a set of values.

Figure 4B:
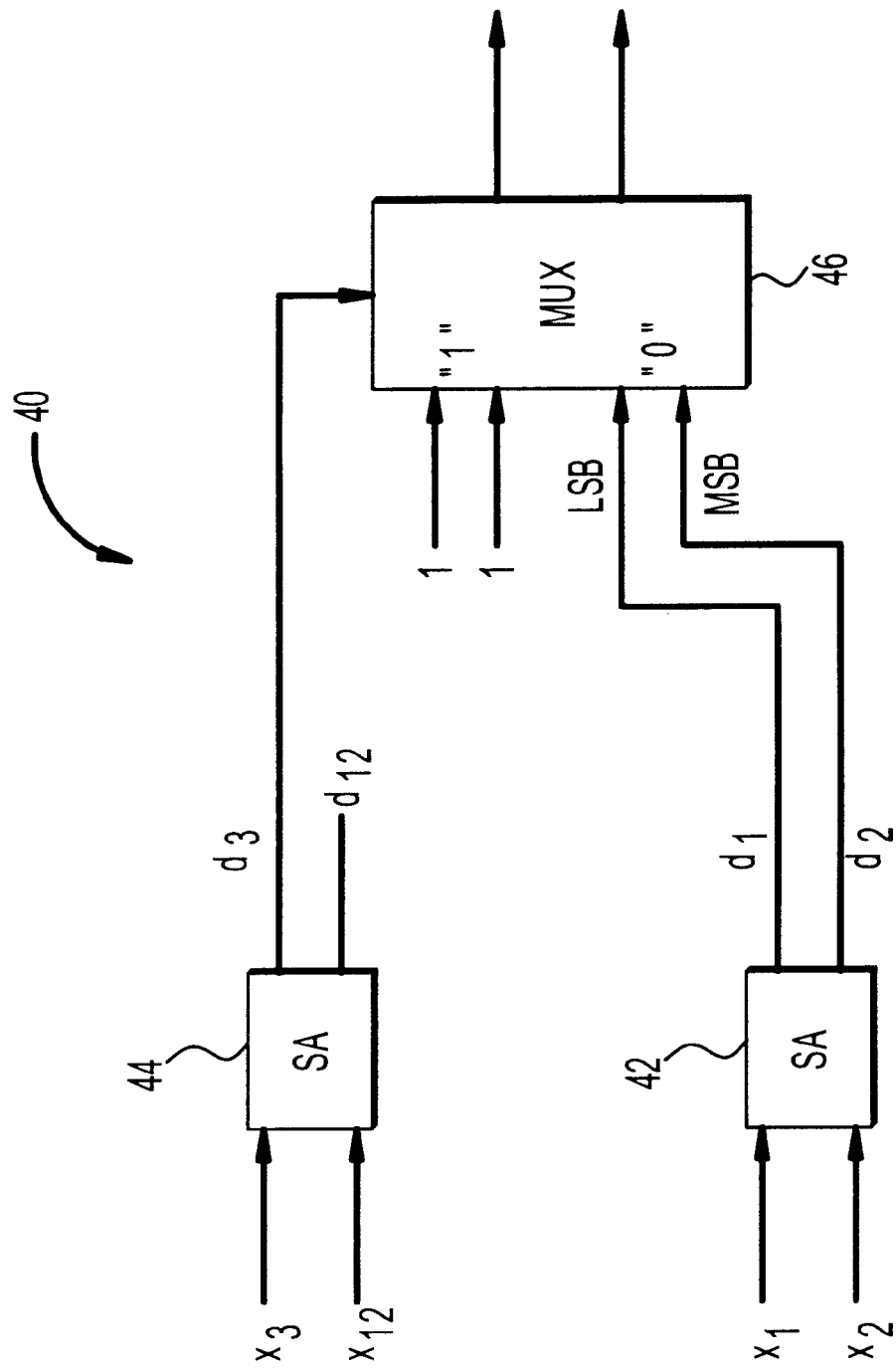
FIGS. 4B, 4C and 4D show exemplary circuits in accordance with the invention for determining the position of a minimum or maximum value in a given set of input signal values.

FIG. 4B shows an illustrative embodiment of a position determination circuit 40 in accordance with the invention for determining the position of a minimum or maximum value. It is assumed in this embodiment that the circuit 40 is supplied with the signals $x_1$, $x_2$, $x_{12}$ and $x_3$ as described in conjunction with comparator 20 of FIG. 3. The signals $x_1$ and $x_2$ are applied to inputs of a two-input sense amplifier 42, and the signals $x_{12}$ and $x_3$ are applied to inputs of a two-input sense amplifier 44. Each of the sense amplifiers 42 and 44 may operate in substantially the same manner as the conventional sense amplifier 10 of FIG. 1. One of the outputs of the sense amplifier 42, i.e., output $d_1$, is supplied to a least significant bit (LSB) input of a multiplexer 46, and the other output of the sense amplifier 42, i.e., output $d_2$, is applied to a most significant bit (MSB) input of the multiplexer 46. An output $d_3$ of the sense amplifier 44 is supplied to a select signal input of the multiplexer 46. If the $d_3$ output of the sense amplifier 44 is a logic "0", the multiplexer 46 outputs the signals applied to its LSB and MSB inputs. If the $d_3$ output of the sense amplifier 44 is a logic "1", the multiplexer 46 will output a pair of fixed logic "1" values. These values are applied to another pair of inputs of the multiplexer 46 as shown.

Returning to the previous example, in which input $x_1$ was assumed to be the greatest of the three inputs $x_1$, $x_2$ and $x_3$, the outputs of sense amplifier 42 will be $d_1=1$ and $d_2=0$, and the outputs of sense amplifier 44 will be $d_{12}=1$ and $d_3=0$. The multiplexer 46 will therefore select its LSB and MSB inputs for propagation to its output. The LSB and MSB inputs will correspond to a logic "1" and a logic "0", respectively, such that the multiplexer 46 will output a "01". This indicates that the position of the maximum value of the three inputs $x_1$, $x_2$ and $x_3$ is position "01", which as shown in FIG. 4A corresponds to the input $x_1$.

As another example, assume that input $x_2$ is the greatest of the three inputs $x_1$, $x_2$ and $x_3$. In this case, the outputs of sense amplifier 42 will be $d_1=0$ and $d_2=1$, and the outputs of sense amplifier 44 will be $d_{12}=1$ and $d_3=0$. The multiplexer 46 will therefore again select its LSB and MSB inputs for propagation to its output. The LSB and MSB inputs will correspond to a logic "038 and a logic "1", respectively, such that the multiplexer 46 will output a "10". This indicates that the position of the maximum value of the three inputs $x_1$, $x_2$ and $x_3$ is position "10", which as shown in FIG. 4A corresponds to the input $x_2$. The circuit 40 of FIG. 4B is thus operative to determine the position of a given maximum value from a given set of comparator inputs. It will be apparent to those skilled in the art that the circuit 40 can similarly be used to determine the position of a minimum value, and that information generated by circuit 40 can be used to arrange a set of inputs in a desired order of value, e.g., in ascending or descending order of value.

Figure 4C:
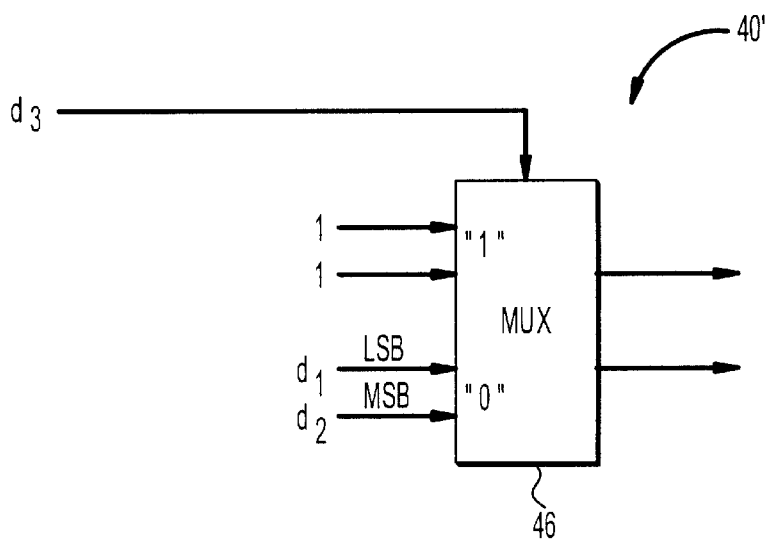

FIG. 4C shows another alternative embodiment of the position determination circuit 40 of FIG. 4B. In this embodiment, a position determination circuit 40' includes the multiplexer 46 of FIG. 4B, but no sense amplifiers. Instead, the $d_3$ output generated by sense amplifier 22-2 in FIG. 3 is applied to the select signal input of the multiplexer 46, and the $d_1$ and $d_2$ outputs generated by sense amplifier 22-1 in FIG. 3 are applied to the LSB and MSB inputs of the multiplexer 46. The operation of position determination circuit 40' is otherwise identical to that of position determination circuit 40 of FIG. 4B.

Figure 4D:
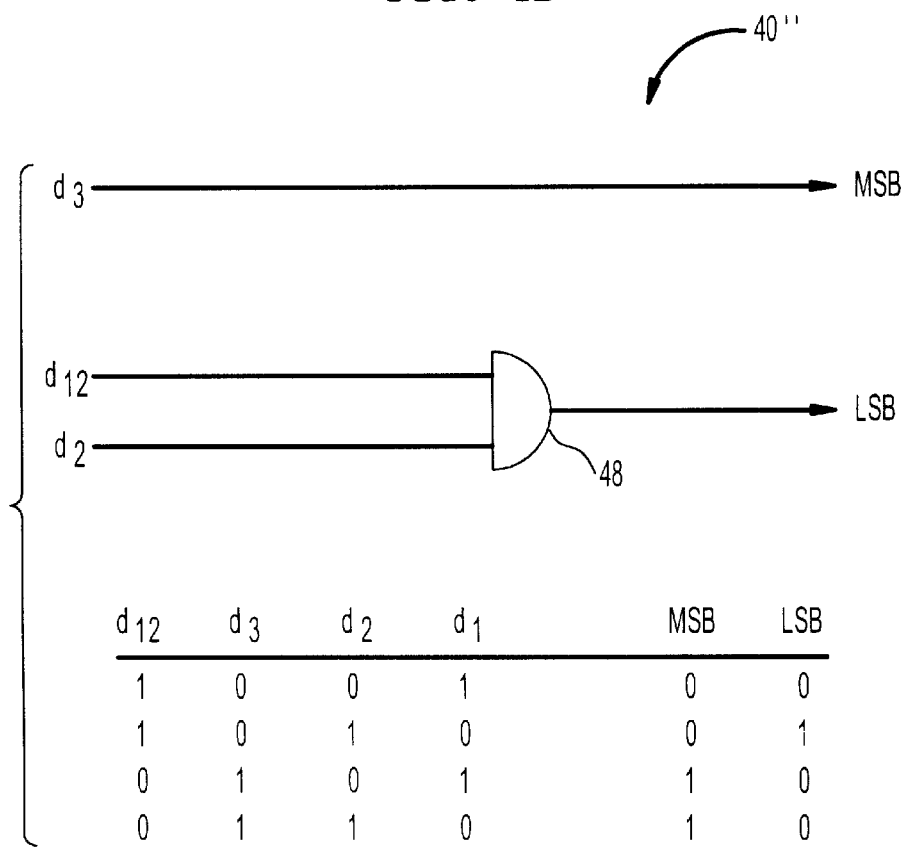

FIG. 4D shows yet another alternative embodiment of the position determination circuit 40 of FIG. 4B. In this embodiment, a position determination circuit 40" includes a two-input AND gate 48. The $d_3$ output generated by sense amplifier 22-2 in FIG. 3 is used as an MSB. The $d_2$ output generated by sense amplifier 22-1 in FIG. 3 is applied to one input of the two-input AND gate 48. The $d_{12}$ output of the sense amplifier 22-2 is applied to the other input of the AND gate 48. The output of the AND gate 48 is used as an LSB. FIG. 4D also shows the relationship between the $d_1$, $d_2$, $d_3$ and $d_{12}$ signals and the MSB and LSB outputs. It can be seen that the MSB and LSB indicate the position of the maximum value in the three inputs $x_1$, $x_2$ and $x_3$. For example, if the MSB=1 and the LSB=0, the maximum value is input $x_3$. Like the other embodiments of FIGS. 4B and 4C, the position determination circuit 40" can also be modified in a straightforward manner to find the position of the minimum value of the three inputs, and the information generated by circuit 40" can be used to arrange the inputs in a desired value order.

Figure 5:
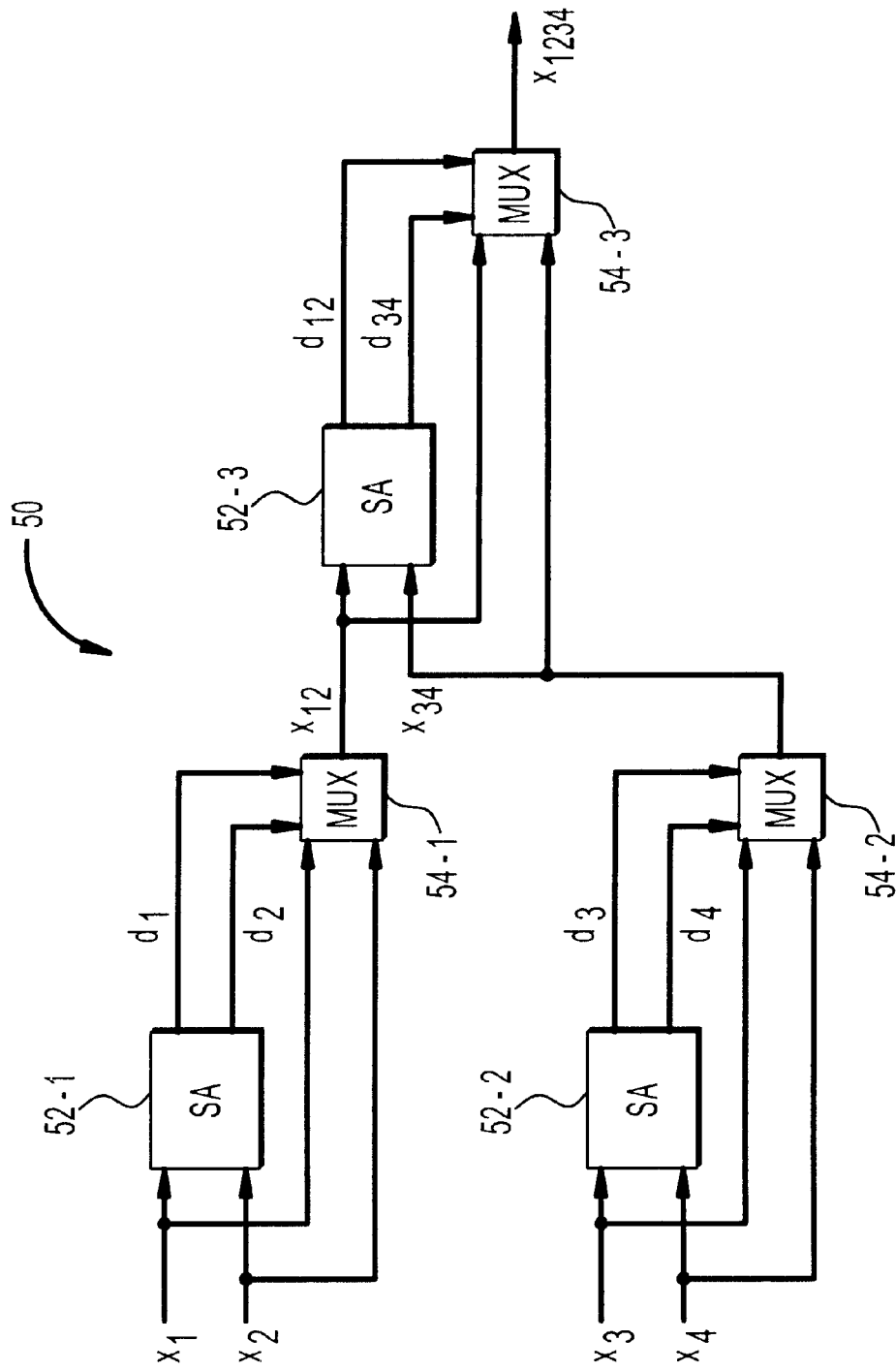
FIG. 5 shows an illustrative embodiment of a four-input comparator with a logarithmic architecture in accordance with the invention.

FIG. 5 shows an illustrative embodiment of a four-input comparator 50 with a logarithmic architecture in accordance with the invention. The comparator 50 includes first, second and third two-input sense amplifiers 52-1, 52-2 and 52-3, and first, second and third two-input multiplexers 54-1, 54-2 and 54-3. Each of the sense amplifiers 52-1, 52-2 and 52-3 may operate in substantially the same manner as the conventional sense amplifier 10 of FIG. 1. The first sense amplifier 52-1 receives two inputs, $x_1$ and $x_2$, and generates two outputs, $d_1$ and $d_2$. The $d_1$ and $d_2$ outputs of sense amplifier 52-1 are applied to select signal inputs of the multiplexer 54-1. The inputs $x_1$ and $x_2$ are applied as signal inputs to the multiplexer 54-1. The output of the multiplexer 54-1 is a signal $x_{12}$ which corresponds to either the input $x_1$ or the input $x_2$, depending on the values of the signals $d_1$ and $d_2$. The second sense amplifier 52-2 receives two inputs, $x_3$ and $x_4$, and generates two outputs, $d_3$ and $d_4$. The $d_3$ and $d_4$ outputs of sense amplifier 52-2 are applied to select signal inputs of the multiplexer 54-2. The inputs $x_3$ and $x_4$ are applied as signal inputs to the multiplexer 54-2. The output of the multiplexer 54-2 is a signal $x_{34}$ which corresponds to either the input $x_3$ or the input $x_4$, depending on the values of the signals $d_3$ and $d_4$.

The signals $x_{12}$ and $x_{34}$ are applied to inputs of the third sense amplifier 52-3. The sense amplifier 52-3 generates outputs $d_{12}$ and $d_{34}$. These outputs are supplied to select signal inputs of the multiplexer 54-3. The inputs $x_{12}$ and $x_{34}$ are applied as signal inputs to the multiplexer 54-3. The output of the multiplexer 54-3 is a signal $x_{1234}$ which corresponds to either the input $x_{12}$ or the input $x_{34}$, depending on the values of the signals $d_{12}$ and $d_{34}$.

Assuming that the sense amplifiers 52-1, 52-2 and 52-3 operate in the manner illustrated in conjunction with FIG.1, the output $x_{1234}$ will correspond to the maximum value of the four inputs $x_1$, $x_2$, $x_3$ and $x_4$. Under this assumption, for example, if input $x_1$ is the greatest of the four inputs, and input $x_3$ is greater than $x_4$, the outputs of sense amplifier 52-1 will be $d_1$=1 and $d_2$=0, and the outputs of sense amplifier 52-2 will be $d_3$=1 and $d_4$=0. Multiplexer 54-1 will therefore select input $x_1$ for propagation to output $x_{12}$, and multiplexer 54-2 will select input $x_3$ for propagation to output $x_4$. The outputs of sense amplifier 52-3 will then be $d_{12}$=1 and $d_{34}$=0, such that multiplexer 54-3 will propagate $x_{12}$=$x_1$ to the output $x_{1234}$. The greatest of the four inputs of comparator 50 is thus propagated to the output of comparator 50.

As in the embodiment of FIG. 3, it will be apparent to those skilled in the art that the comparator 50 can be configured such that the output $x_{1234}$ will correspond to the minimum value of the four inputs $x_1$, $x_2$, $x_3$ and $x_4$. In addition, the logarithmic architecture illustrated in FIG. 5 can be extended in a straightforward manner to accommodate more than four inputs, and is generally applicable to any number $N=2^k$, k=1, 2, 3..., of inputs. Advantageously, the logarithmic architecture illustrated in FIG. 5 provides a considerable improvement in computation speed relative to a linear architecture, particularly for applications involving three or more inputs. The signals generated in the comparator 50 or in other logarithmic architecture comparators in accordance with the invention may also be used in a position determination circuit such as circuit 40 to determine the position of a given maximum or minimum value, as well as to provide any desired ordering of values.

Figure 6:
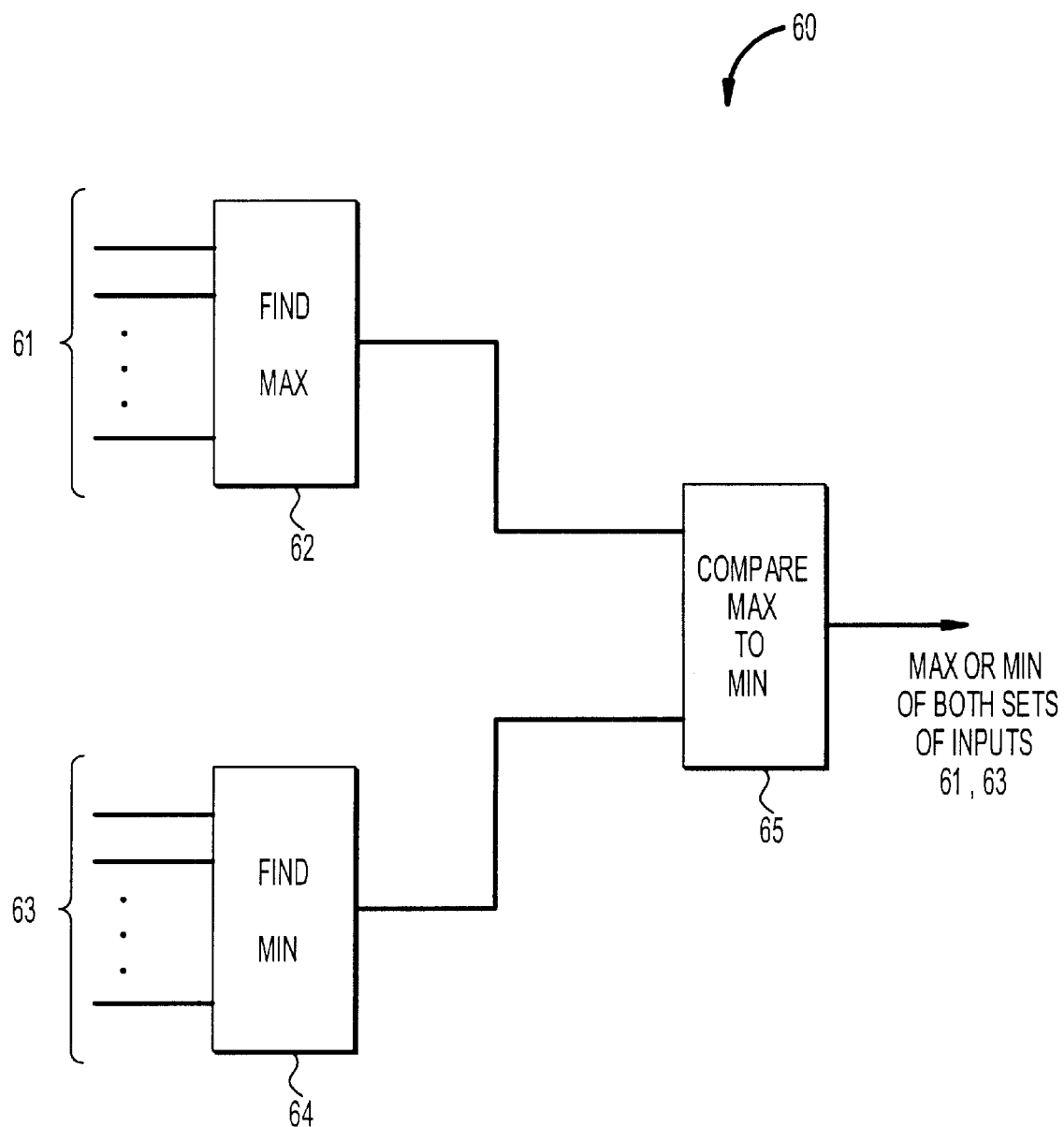
FIG. 6 shows another embodiment of a multi-input comparator in accordance with the invention.

FIG. 6 shows a multi-input comparator 60 in accordance with another embodiment of the invention. In this embodiment, a first set of inputs 61 is applied to a first multi-input comparator 62 which is configured to determine the maximum of the set of inputs 61. A second set of inputs 63 is applied to a second multi-input comparator 64 which is configured to determine the minimum of the set of inputs 63. The maximum of the first set of inputs 61 is then compared with the minimum of the second set of inputs 63 in another comparator 65. The output of comparator 65 provides an indication of the relative magnitudes of the two sets of inputs 61 and 63. For example, it can be configured to determine the maximum of the two sets of inputs 61 and 63, or the minimum of the two sets of inputs. The comparators 62, 64 and 65 may be configured in accordance with the logarithmic architecture described previously. For example, comparator 62 may correspond to the sense amplifier 52-1 and multiplexer 54-1 of FIG. 5, the comparator 64 may correspond to the sense amplifier 52-2 and multiplexer 54-2, and the comparator 65 may correspond to the sense amplifier 52-3 and multiplexer 54-3. Other suitable arrangements, including a linear architecture, could be used for one or more of the comparators 62, 64 and 65.

It should be emphasized that the exemplary multi-input analog comparators and other supporting circuitry described herein are intended to illustrate the operation of the invention, and therefore should not be construed as limiting the invention to any particular embodiment or group of embodiments. For example, although well suited for implementation with two-input sense amplifiers, the invention can be used with sense amplifiers having more than two inputs, and can be used with sense amplifiers or other similar devices that operate in ways other than that described herein. In addition, although particularly well suited for use with analog values, the invention can also be applied to other types of signal values, including DC level values and digital signal values. Moreover, embodiments of the invention can be implemented in a wide variety of different configurations to accommodate the needs of particular applications. These and numerous other alternative embodiments within the scope of the following claims will therefore be apparent to those skilled in the art.

What is claimed is:

1. An apparatus for determining relative characteristics of signal values, comprising:
   a first comparison circuit having a plurality of inputs and at least one output, wherein each of at least a subset of the signal values is applied to a corresponding one of the inputs, the first comparison circuit being configured to compare the signal values applied to the inputs thereof and to identify a particular one of the applied signal values as having a particular magnitude relative to the one or more other applied signal values; and
   a first multiplexer having a plurality of inputs, with one of the signal values applied to each of the inputs, and a select signal input coupled to the output of the comparison circuit, wherein the multiplexer is configured to select at least one of the signal values based on the output of the comparison circuit.

2. The apparatus of claim 1 wherein the first multiplexer selects a maximum signal value from the signal values applied to its inputs.

3. The apparatus of claim 1 wherein the first multiplexer selects a minimum signal value from the signal values applied to its inputs.

4. The apparatus of claim 1 further including a position determination circuit comprising:
   a first sense amplifier for receiving at least a subset of the signal values;
   a second multiplexer having a set of inputs coupled to a corresponding set of outputs of the first sense amplifier; and
   at least one additional sense amplifier for receiving at least one output from at least one additional comparison circuit, wherein an output of the additional sense amplifier is applied to a select signal input of the second multiplexer.

5. The apparatus of claim 1 further including a position determination circuit comprising a second multiplexer having a set of inputs coupled to a corresponding set of outputs of the first comparison circuit, and a select signal input coupled to an output of an additional comparison circuit.

6. The apparatus of claim 1 further including a position determination circuit comprising a logic circuit having at least one input coupled to an output of the first comparison circuit, and at least one input coupled to an output of an additional comparison circuit.

7. An apparatus for determining relative characteristics of signal values, comprising:
   a first comparison circuit having a plurality of inputs and at least one output, wherein each of at least a subset of the signal values is applied to a corresponding one of the inputs; and
   a first multiplexer having a plurality of inputs, with one of the signal values applied to each of the inputs, and a select signal input coupled to the output of the comparison circuit, wherein the multiplexer is configured to select at least one of the signal values based on the output of the comparison circuit;
   wherein the first comparison circuit is a sense amplifier.

8. An apparatus for determining relative characteristics of signal values, comprising:
   a first comparison circuit having a plurality of inputs and at least one output, wherein each of at least a subset of the signal values is applied to a corresponding one of the inputs;
   a first multiplexer having a plurality of inputs, with one of the signal values applied to each of the inputs, and a select signal input coupled to the output of the comparison circuit, wherein the multiplexer is configured to select at least one of the signal values based on the output of the comparison circuit;
   at least one additional comparison circuit having a set of inputs including an input coupled to an output of the first multiplexer, and a set of outputs; and
   at least one additional multiplexer, wherein at least a subset of the set of inputs of the additional comparison circuit are coupled to corresponding inputs of the additional multiplexer, and at least a subset of the set of outputs of the additional comparison circuit are coupled to corresponding select signal inputs of the additional multiplexer, such that the additional multiplexer selects at least one of the set of inputs of the additional comparison circuit based on at least one output of the additional comparison circuit.

9. An apparatus for determining relative characteristics of signal values, comprising:
   a first comparison circuit having a plurality of inputs and at least one output, wherein each of at least a subset of the signal values is applied to a corresponding one of the inputs;
   a first multiplexer having a plurality of inputs, with one of the signal values applied to each of the inputs, and a select signal input coupled to the output of the comparison circuit, wherein the multiplexer is configured to select at least one of the signal values based on the output of the comparison circuit; and
   an additional N-2 comparison circuits and a corresponding additional N-2 multiplexers configured to determine relative magnitudes of N signal values.

10. The apparatus of claim 9 wherein the additional N-2 comparison circuits and the corresponding N-2 multiplexers are arranged with the first comparison circuit and first multiplexer in a linear architecture.

11. The apparatus of claim 9 wherein the additional N-2 comparison circuits and the corresponding N-2 multiplexers are arranged with the first comparison circuit and the first multiplexer in a logarithmic architecture.

12. An apparatus for determining relative characteristics of signal values, comprising:
   a first comparison circuit having a plurality of inputs and at least one output, wherein each of at least a subset of the signal values is applied to a corresponding one of the inputs;
   a first multiplexer having a plurality of inputs, with one of the signal values applied to each of the inputs, and a select signal input coupled to the output of the comparison circuit, wherein the multiplexer is configured to select at least one of the signal values based on the output of the comparison circuit; and
   a position determination circuit operative to generate information which can be used to order the signal values in a particular order of signal magnitude.

13. A method for determining relative characteristics of N signal values, comprising:
   comparing at least a subset of the N signal values in a first comparison circuit, the first comparison circuit being configured to compare the signal values applied thereto and to identify a particular one of the applied signal values as having a particular magnitude relative to the one or more other applied signal values;
   applying the subset of the N signal values to a set of multiplexer inputs; and utilizing an output of the first comparison circuit to select one of the subset of N values for propagation to an output of the multiplexer.

14. An apparatus for determining relative characteristics of N signal values, comprising:

a first comparison circuit having inputs for receiving a subset of the N signal values;

a first multiplexer having a select signal input coupled to an output of the first comparison circuit, and inputs coupled to the subset of the N signal values;

N-2 additional comparison circuits; and

N-2 additional multiplexers coupled to corresponding ones of the N-2 additional comparison circuits, wherein the first comparison circuit and the N-2 additional comparison circuits, and the first multiplexer and the N-2 additional multiplexers, are arranged to select a particular one of the N signal values.

15. The apparatus of claim 14 wherein an output of the first multiplexer is applied to an input of one of the N-2 additional comparison circuits.

16. The apparatus of claim 14 wherein an output of the one of the additional N-2 multiplexers is applied to an input of one of the N-2 additional comparison circuits.

17. The apparatus of claim 14 wherein an output of the one of the additional N-2 multiplexers corresponds to the selected one of the N signal values.

18. The apparatus of claim 14 wherein the additional N-2 comparison circuits and the corresponding N-2 multiplexers are arranged with the first comparison circuit and first multiplexer in a linear architecture.

19. The apparatus of claim 14 wherein the additional N-2 comparison circuits and the corresponding N-2 multiplexers are arranged with the first comparison circuit and the first multiplexer in a logarithmic architecture.

20. The apparatus of claim 14 further including a position determination circuit operative to generate information which can be used to order the N signal values in a particular order of signal magnitude.

* * * * *